United States Patent [19]
Hama

[11] Patent Number: 6,089,182
[45] Date of Patent: Jul. 18, 2000

[54] PLASMA PROCESSING APPARATUS

[75] Inventor: Kiichi Hama, Chino, Japan

[73] Assignee: Tokyo Electron Limited, Tokyo, Japan

[21] Appl. No.: 08/940,980

[22] Filed: Sep. 30, 1997

Related U.S. Application Data

[63] Continuation-in-part of application No. 08/689,780, Aug. 14, 1996, Pat. No. 5,716,451.

[30] Foreign Application Priority Data

| Aug. 17, 1995 | [JP] | Japan | 7-233333 |
| Aug. 31, 1995 | [JP] | Japan | 7-246607 |
| Apr. 23, 1996 | [JP] | Japan | 8-127941 |
| Oct. 2, 1996 | [JP] | Japan | 8-281370 |

[51] Int. Cl.[7] .................................................. C23C 16/00
[52] U.S. Cl. ........................ 118/723 I; 118/723 R; 118/723 AN; 118/723 ER; 118/723 IR; 156/345 P; 156/345 C; 156/345 PW
[58] Field of Search ................ 118/723 R, 723 AN, 118/723 ER, 723 I, 723 IR; 156/345 P, 345 CS, 345 PW

[56] References Cited

U.S. PATENT DOCUMENTS

| 5,522,934 | 6/1996 | Suzuki et al. | 118/723 AN |
| 5,525,159 | 6/1996 | Hama et al. | 118/723 I |
| 5,531,834 | 7/1996 | Ishizuka et al. | 118/723 I |
| 5,571,366 | 11/1996 | Ishii et al. | 156/345 |
| 5,580,385 | 12/1996 | Paranjpe et al. | 118/723 I |

*Primary Examiner*—Nasser Ahmad
*Attorney, Agent, or Firm*—Oblon, Spivak, McClelland, Maier & Neustadt, P.C.

[57] ABSTRACT

A plasma etching apparatus of the induction coupling type for processing an LCD substrate has a process container forming an airtight process room. A work table is arranged in the process room for supporting the LCD substrate. A vacuum pump is arranged for exhausting and setting the process room into a vacuum state. An antenna block having a plurality of dielectric layers is arranged to face the work table. An RF antenna is embedded in one of the dielectric layers of the antenna block for forming an electric field. A power supply is connected to the RF antenna for applying an RF power. The lowermost layer of the antenna block is formed as a shower head for supplying a process gas into the process room from a position between the RF antenna and the work table. At least part of the process gas is turned into plasma by the electric field. In the layer formed as the shower head, the gas passage has such a projected area ratio, on a planar outer-contour of the mount surface of the work table, that is from 15% to 25%.

17 Claims, 9 Drawing Sheets

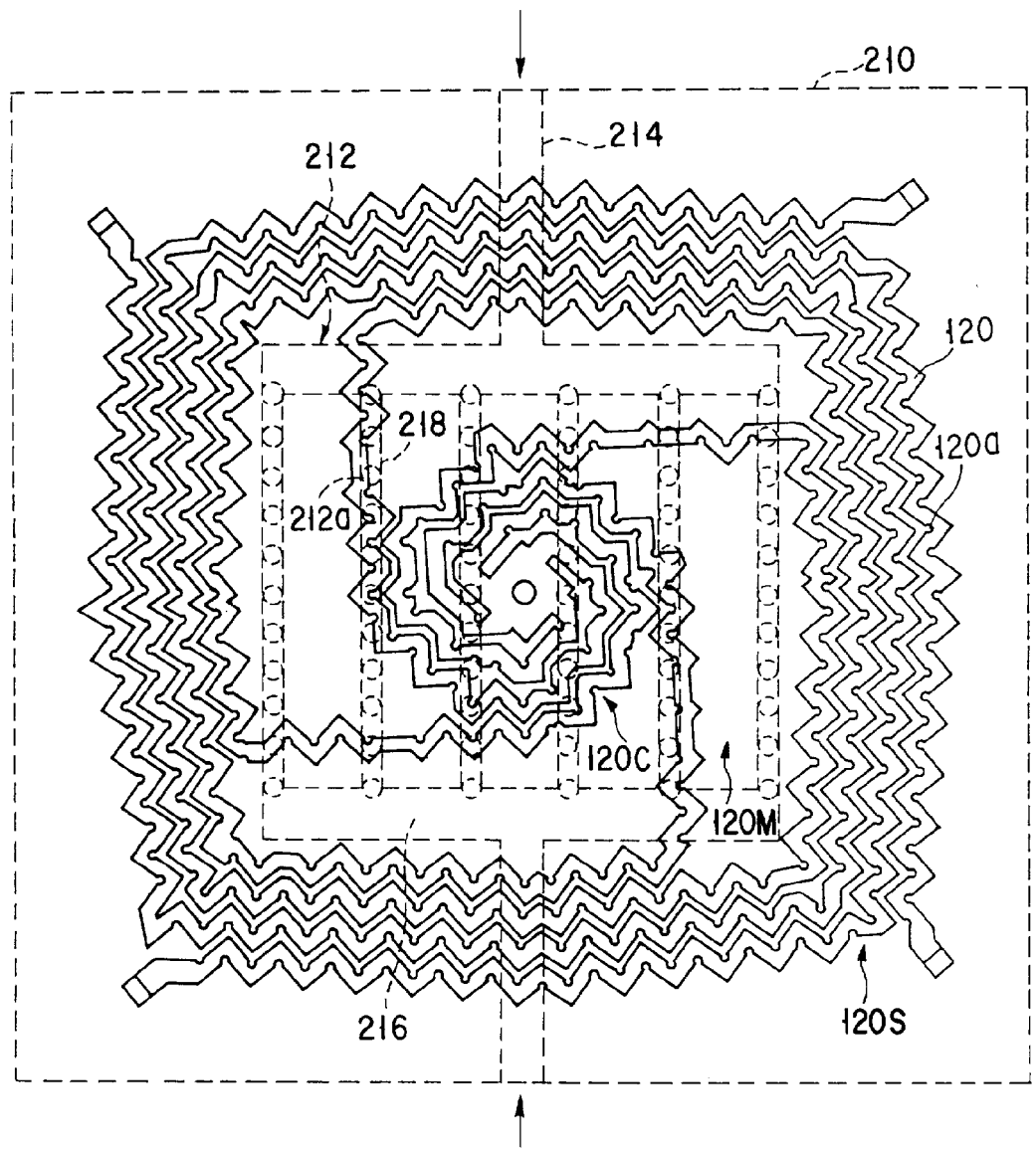
F I G. 8

PLASMA PROCESSING APPARATUS

CROSS-REFERENCE TO RELATED APPLICATIONS

This application is a continuation-in-part of U.S. patent application Ser. No. 08/689,780 filed Aug. 14, 1996, now U.S. Pat. No. 5,716,451.

BACKGROUND OF THE INVENTION

The present invention relates to a plasma processing apparatus, and particularly to a plasma processing apparatus of the induction coupling type in which induction plasma is excited in a process room by applying an RF (radio frequency) power to an RF antenna.

In recent years, with an increase in the degree of integration level of a semiconductor device and an LCD (liquid crystal display), it has become necessary to perform an ultra fine process of the order of sub-micron and furthermore of sub-half-micron. In order to perform such a process in a plasma processing apparatus, it is important to control high density plasma with high accuracy under a low pressure atmosphere, such as between 1 mTorr and 50 mTorr. It is also necessary to form the plasma to have a high uniformity and a large area so as to correspond to a wafer of a large diameter or an LCD substrate of a large size.

In consideration of these technical demands, a lot of approaches have been made to establish a new plasma source. For example, EP-A-0,379,828 discloses a plasma processing apparatus of the RF induction coupling type using an RF antenna. As shown in FIG. 12, the plasma processing apparatus 10 of the RF induction coupling type is designed such that one side, e.g., the ceiling side, of a process room 16, which faces a work table 14 for supporting a target object 12, is made of a dielectric body 18, such as quartz glass. An RF antenna 20 formed of, for example, a spiral coil, is disposed on the outside of the dielectric body 18. An electric field is formed in the process room 16 by applying an RF power to the RF antenna 20 from an RF power supply 22 through a matching circuit 24. Electrons flowing in the electric field are made to collide with neutral particles in a process gas, so that the gas is dissociated and plasma is generated.

An RF power for generating a bias is applied to the work table 14 so that a plasma flow incident on the target surface of the target object 12 is accelerated. An exhaust port 28 communicating with exhaust means (not shown) is arranged at the bottom of the process room 16, so that the inside of the process room 16 can be set to have a predetermined pressure atmosphere. A process gas supply port 30 is arranged at the center of the dielectric body 18 forming the ceiling of the process room 16 to feed a predetermined process gas into the process room 16.

In such a conventional plasma processing apparatus of the RF induction coupling type, a dielectric body, on which an RF antenna is arranged, constitutes the ceiling of a process room, which is kept at a low pressure atmosphere. For this reason, it is necessary for the dielectric body to have a large thickness so that it can withstand a pressure difference between the outside and inside of the process room. As a result, a problem arises such that the coefficient of use of an applied energy from an RF power supply is decreased. This problem becomes prominent in a plasma processing apparatus having a big size for processing a wafer of a large diameter or an LCD substrate of a large surface area.

Further, unlike the apparatus using the gas supply port 30 shown in FIG. 12, there is a conventional plasma processing apparatus of the RF induction coupling type which employs a shower head for supplying a process gas into a process room in combination with an RF antenna, in order to suit an increase in the size of a target object. The shower head generally has such a structure that the process gas fed through a gas supply port flows through a distribution room and is then spouted from a number of small holes into the process room. Therefore, in the plasma processing apparatus of the RF induction coupling type having the shower head, the distribution room of the shower head is interposed between the RF antenna and the plasma generation space of the process room. As a result, part of an RF energy supplied from the antenna is consumed by generating plasma in the distribution room, thereby decreasing the RF energy to be supplied to the process room.

BRIEF SUMMARY OF THE INVENTION

The present invention has been made in consideration of the above described problems caused in a conventional plasma processing apparatus of the RF induction coupling type.

Therefore, it is an object of the present invention to provide a plasma processing apparatus of the RF induction coupling type, which can increase the coefficient of use of an applied energy from an RF power supply, and generate uniform plasma of a high density even under a low pressure condition.

It is another object of the present invention to provide a plasma processing apparatus of the RF induction coupling type having a shower head, which can uniformly turn a process gas into plasma, thereby accurately controlling the progress of dissociation of the process gas.

According to a first aspect of the present invention, there is provided a plasma processing apparatus for processing a target substrate, using a plasma, comprising:

a process container forming an airtight process room;

a work table arranged in the process room and having a mount surface for supporting the target substrate;

a main exhaust for exhausting and setting the process room into a vacuum state;

an RF antenna for generating an electric field above the mount surface in the process room;

a power supply section for applying an RF power to the RF antenna; and a main supply for supplying a process gas into the process room, at least part of the process gas being turned into the plasma by the electric field, wherein the main supply comprises a shower head arranged between the mount surface and the RF antenna to face the mount surface, and the shower head comprises a gas passage extending substantially parallel to the mount surface and a plurality of gas spouting holes opened toward the mount surface, wherein, the shower head is defined by a dielectric panel consisting essentially of a dielectric solid part and a hollow including the gas passage, and $A2/(A1+A2)$ is set to be less than 0.4 where the solid part and the hollow have projected areas $A1$ and $A2$, respectively, on a planar outer-contour of the mount surface.

According to a second aspect of the present invention, there is provided a plasma processing apparatus for processing a target substrate, using a plasma, comprising:

a process container forming an airtight process room;

a work table arranged in the process room and having a mount surface for supporting the target substrate;

a main exhaust for exhausting and setting the process room into a vacuum state;

an antenna block arranged in contact with an inner surface of the process room and facing the mount surface;

an RF antenna arranged in the antenna block, for generating an electric field above the mount surface in the process room;

a power supply section for applying an RF power to the RF antenna; and a main supply for supplying a process gas into the process room, at least part of the process gas being turned into the plasma by the electric field, wherein the main supply comprises a shower head defined by an opposite wall of dielectric of the antenna block, which is present between the mount surface and the RF antenna to face the mount surface, and the shower head comprises a gas passage extending substantially parallel to the mount surface and a plurality of gas spouting holes opened toward the mount surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a plan view showing a positional relation between an RF antenna and a process gas passage in the etching apparatus shown in FIG. 7;

DETAILED DESCRIPTION OF THE INVENTION

Figure 1:
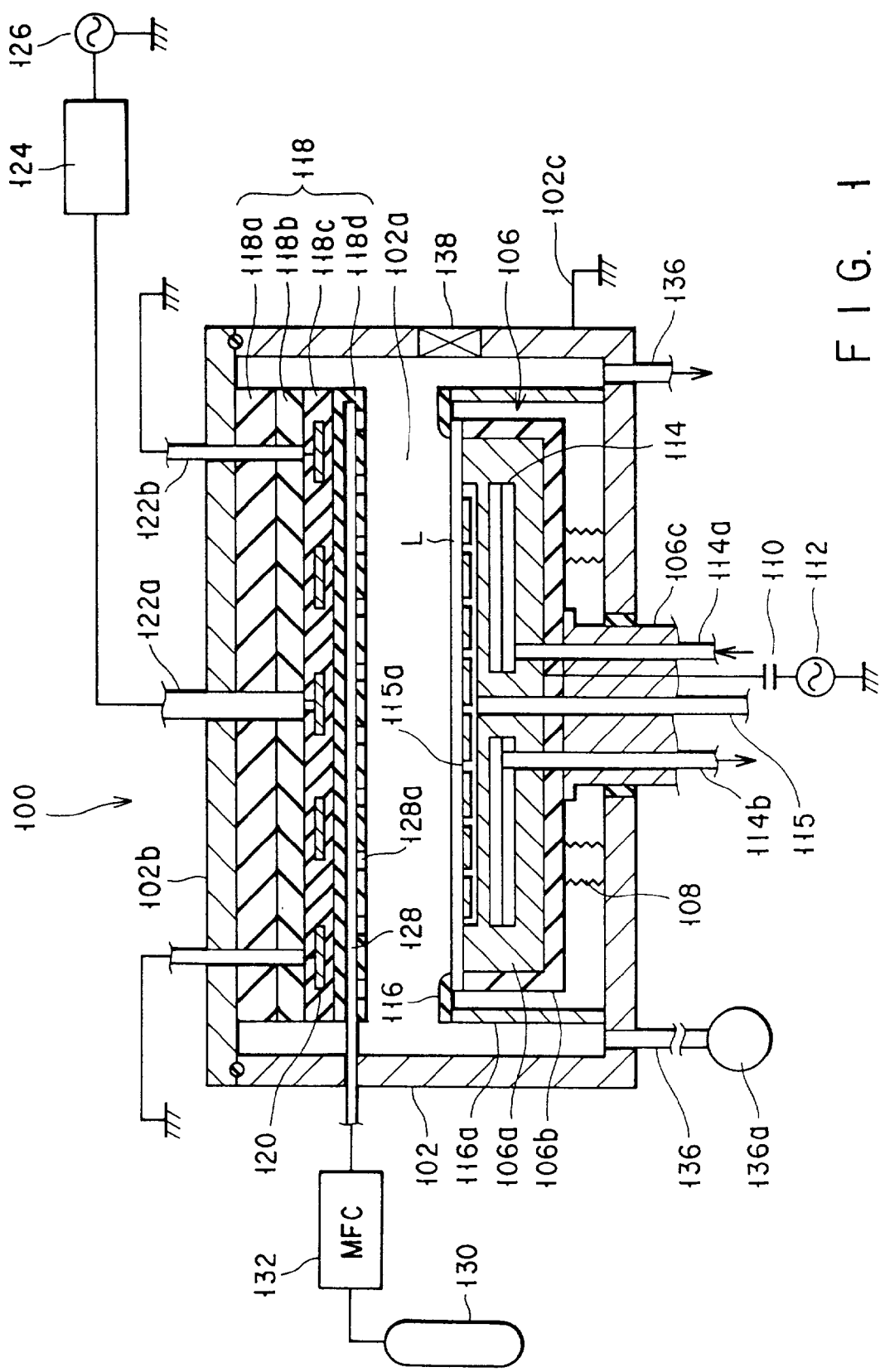
FIG. 1 is a cross-sectional view showing an etching apparatus of an LCD substrate, which is an application of a plasma processing apparatus according to an embodiment of the present invention.

FIG. 1 is a cross-sectional view showing an etching apparatus of an LCD substrate, which is an application of a plasma processing apparatus according to an embodiment of the present invention.

The plasma etching apparatus 100 shown in FIG. 1 has a process container 102 which is made of a conductive material, such as aluminum having an oxidized alumite surface or stainless steel, and has a cylindrical or rectangular box shape. A predetermined etching process is performed in a process room 102a formed in the process container 102.

The process container 102 is grounded through a line 102c. A work table 106 having an essentially rectangular shape is arranged on the bottom of the process container 102 for mounting a target object, such as an LCD substrate L. The work table 106 is constituted by an electrode portion 106a made of a conductive material, such as aluminum having an oxidized alumite surface or stainless steel, and an electrode protecting portion 106b made of an insulating material, such as ceramics, and surrounding the electrode portion 106a except the mount surface. The work table 106 is attached to the top of an elevating shaft 106c penetrating the bottom of the process container 102. The elevating shaft 106c is movable in a vertical direction by the driving force of an elevating mechanism (not shown), so that the entirety of the work table 106 can be moved up and down, when necessary. An expandable bellows 108 is arranged around the elevating shaft for securing the airtightness inside the process room 102a.

An RF power supply 112 is electrically connected to the electrode portion 106a of the work table 106 through a matching circuit 110. During a plasma process, a predetermined RF power of, for example, 2 MHz is applied to the electrode portion 106a to generate a bias potential, so that plasma excited in the process room 102a is effectively attracted to the target surface of the substrate L. Although the apparatus shown in FIG. 1 is constituted such that an RF power is applied to the work table 106, the apparatus may be constituted such that the work table 106 is simply grounded.

A cooling jacket 114 is arranged in the electrode portion 106a of the work table 106. A coolant, such as ethyleneglycol, whose temperature is adjusted by a chiller, is fed into the cooling jacket 114 through a coolant supply pipe 114a. The ethyleneglycol thus supplied generates cold while circulating in the cooling jacket 114. With this arrangement, cold from the ethyleneglycol is transmitted to the substrate L from the cooling jacket 114 through the work table 106, so that the target surface of the substrate L is thermally controlled to have a preferable temperature. The circulated ethyleneglycol is exhausted to the outside of the process container 102 through a coolant exhaust pipe 114b. Heating means, such as a heater, may be arranged in the work table 106, though it is not shown in FIG. 1, for thermally controlling the target surface of the substrate L.

A plurality of holes 115a are formed in the mount surface of the work table 106. A certain heat transmission gas, such as helium, is fed to a space between the mount surface of the work table 106 and the backside of the substrate L through a gas supply pipe 115 and the holes 115a, so that the heat transmission coefficient is increased. By doing this, the substrate can be thermally controlled in an efficient manner even under a low pressure atmosphere.

A clamp frame 116 is arranged above the work table 106 for clamping the periphery of the substrate L. The clamp frame 116 is supported by, for example, four support pillars 116a standing around the work table 106. When the work table 106 supporting the substrate L is moved up and the periphery of the substrate L is brought into contact with the clamp frame 116, the substrate L is mounted and fixed to the work table 106. Pusher pins (not shown) are also arranged in the work table 106, so that the substrate L is transferred onto the work table 106 or lifted up from the work table 106, by movement of the pusher pins in vertical directions.

An antenna block 118, in which an RF antenna 120 is embedded, is arranged in contact with that ceiling plate 102b of the process container 102, which substantially faces the mount surface of the work table 106 for the substrate L. The antenna block 118 has a multi-layer structure having, for example, four layers each consisting essentially of a dielectric material, as shown in FIG. 1. To be exact, the antenna block 118 is formed of a Pyrex glass layer 118a, a quartz layer 118b, an antenna embedding layer 118c containing the RF antenna 120 embedded in compacted powder of a dielectric material, such as mica, and a process gas supply layer 118d made of quartz in which a process gas passage is formed.

The materials of the four layers should be selected such that they have similar coefficients of thermal expansion, so that the layers are prevented from separating from each other due to heat generated by the RF antenna 120 when an RF power is applied to the antenna 120. Although mica and Pyrex glass are used in consideration of workability and cost, all the four layers may be made of quartz. Further, the number of the stacked dielectric layers is not limited to four, but may be more. In contrast, the antenna block 118 may not have a multi-layer structure, but may be formed of a single dielectric layer in which an RF antenna is embedded.

The ceiling plate 102b of the process container 102 is detachable along with antenna block 118 and the RF antenna 120. With this arrangement, maintenance of the antenna block 118 and the RF antenna 120 can be easily performed.

Figure 2:
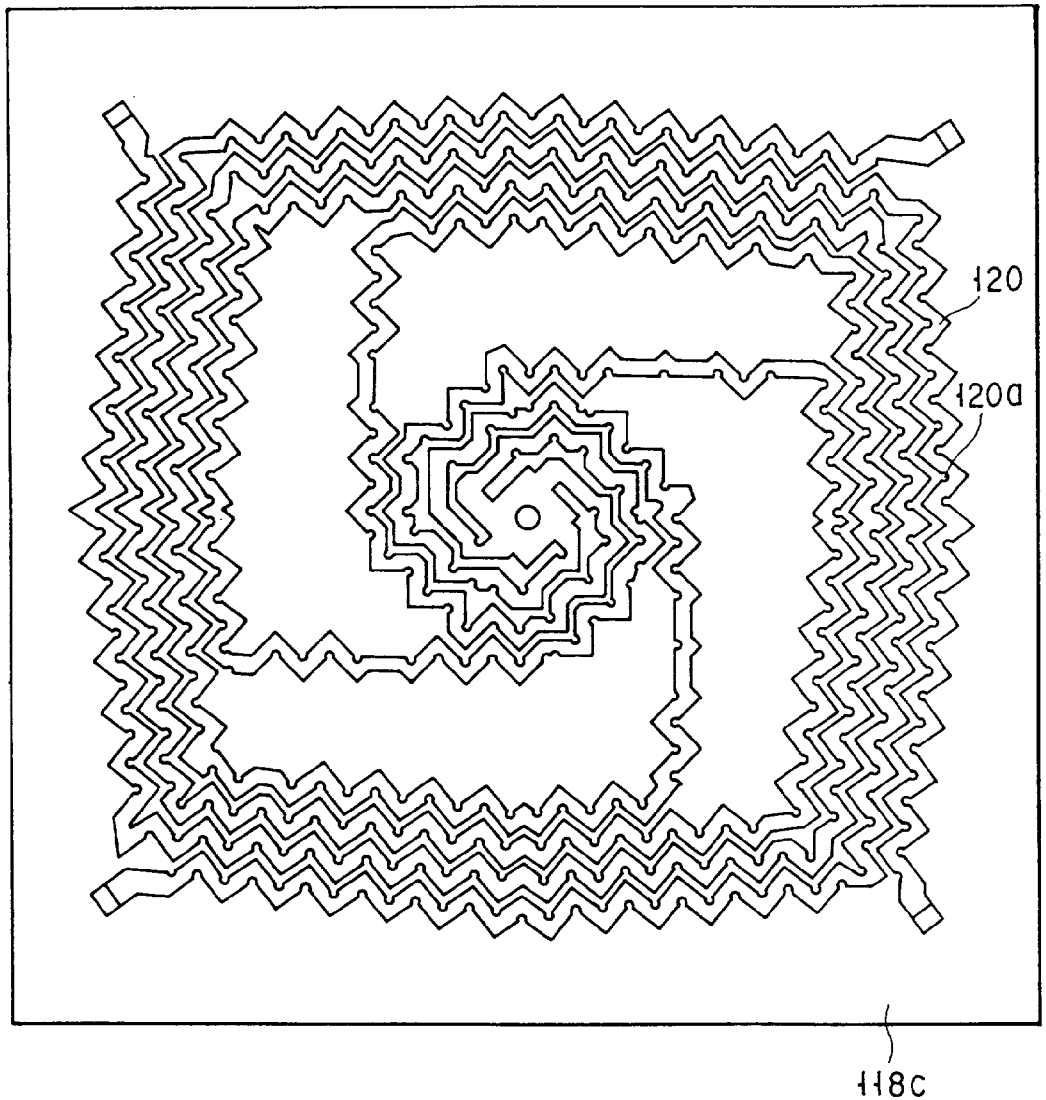
FIG. 2 is a plan view schematically showing an RF antenna embedded in a dielectric layer of the etching apparatus shown in FIG. 1.

As shown in FIG. 2, the antenna embedding layer 118c has a structure in which the RF antenna 120, formed of a conductive strip, such as a copper, aluminum, or stainless steel plate, is embedded in a dielectric layer formed of, for example, compacted mica powder. Since the RF antenna 120 is embedded in the dielectric material powder, the antenna embedding layer 118c can absorb thermal expansion of the RF antenna 120, so that separation and the like are prevented from occurring.

Where the RF antenna 120 is embedded in a common solid dielectric body, such as a quartz layer, since the coefficient of thermal expansion of the dielectric layer and that of the RF antenna 120 differ from each other, it is possible for them to cause separation therebetween due to distortion generated by thermal expansion of the RF antenna 120 when an RF power is applied to the RF antenna 120 and the antenna 120 and part therearound are heated. In this case, therefore, it is preferable to form notches 120a in many places of the RF antenna 120 so that thermal expansion of the RF antenna 120 is absorbed by the notches 120a, as shown in FIG. 2.

According to this embodiment, the notches 120a are formed in the RF antenna 120 while the dielectric material powder is used. As a result, thermal expansion of the RF antenna 120 is absorbed by means of a synergistic effect to suppress distortion, so that an undesirable phenomenon, such as separation, can be prevented from occurring.

Although the RF antenna 120 is formed of a spiral coil of several turns in FIG. 2, the RF antenna 120 can be modified as long as it has an antenna function for generating plasma, and may be formed of a coil with few turns when the frequency of the RF power is high.

Returning to FIG. 1, an electric supply passage 122a and a ground line passage 122b are arranged to penetrate the Pyrex glass layer 118a and the quartz layer 118b and to reach the RF antenna 120 in the mica layer 118c. An RF power supply 126 is connected to the electric supply passage 122a through a matching circuit 124. During a plasma process, an RF power of a predetermined frequency, such as 13.56 MHz, is applied to the RF antenna 120 from the RF power supply 126, so that induction plasma is excited in the process room 102a. The dielectric body interposed between the RF antenna 120 and the ceiling plate 102b of the grounded process container 102 works for preventing the capacity component of the RF antenna 120 from being increased by an influence of the ground.

Figure 3:
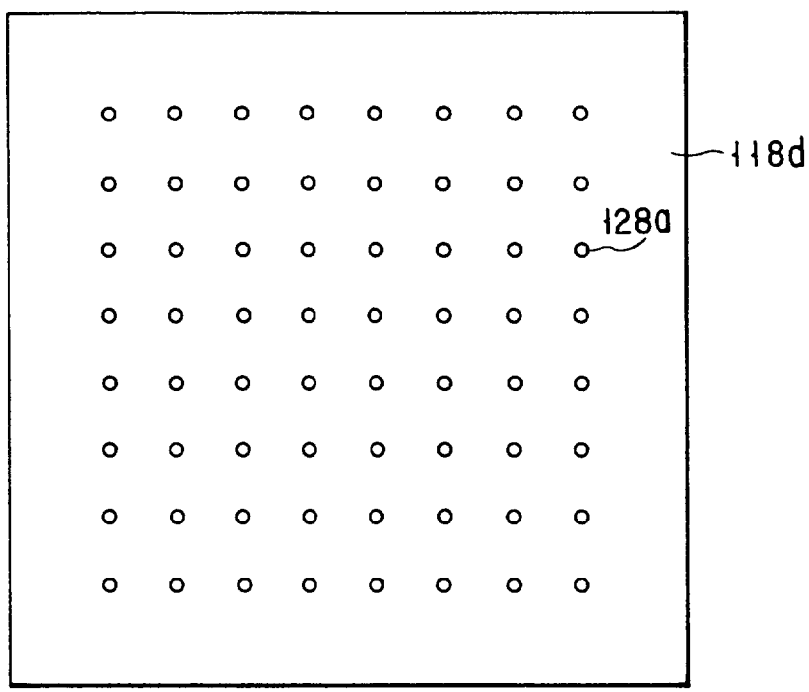
FIG. 3 is a plan view showing a process gas supply layer of the etching apparatus shown in FIG. 1.

The process gas supply layer 118d is constituted such that the gas passage 128 is formed in a panel formed of a dielectric body, e.g., quartz. As shown in FIG. 3, a number of holes 128a communicating with the gas passage 128 are formed in the surface of the process gas supply layer 118d on the work table 106 side, so that a shower head is constituted. A predetermined process gas, such as $CF_4$ gas for etching $SiO_2$, or $BCl_3+Cl_2$ gas for etching Al, is fed into the gas passage 128 from a process gas source 130 through a flow controller (MFC) 132, and then is spouted out from the holes 128a like a shower into the process room 102a. As a result, uniformity of a process gas density in the process room 102a is increased, so that plasma having a uniform density is excited in the process room 102a.

Figure 4:
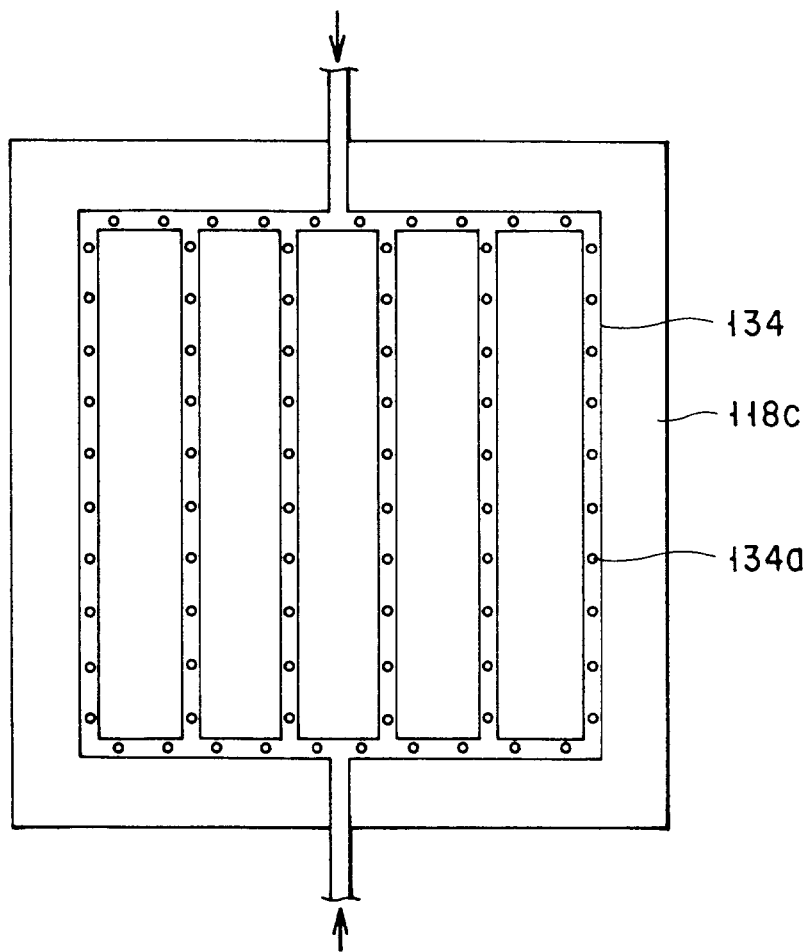
FIG. 4 is a plan view showing a modification of the process gas supply layer of the etching apparatus shown in FIG. 1.

Although the process gas supply layer 118d is part of the multi-layer structure in FIG. 3, a process gas supply pipe structure 134 made of a dielectric material such as quarts may be used instead, and arranged on the antenna embedding layer 118c on the work table 106 side, as shown in FIG. 4. In this case, a number of holes 134a are formed in the process gas supply pipe structure 134 on the work table 106 side, so that a process gas is spouted out from the holes 134a into the process room 102a.

A cooling water passage may be formed in the antenna block 118 for circulating cooling water. With this arrangement, the RF antenna 120 heated by application of an RF power is cooled, so that the lives of the RF antenna 120 and the antenna block 118 are extended.

The antenna block 118 and the RF antenna 120 of the etching apparatus 100 according this embodiment are integrally arranged in the process container 102. As a result, the thickness of a dielectric body arranged between the RF antenna 120 and the target object can be set small, even though there is a substantial pressure difference between the atmosphere and the inside of the process room. It follows that an electric field formed in the process room 102a can become strong, with an RF power applied to the RF antenna 120 from the RF power supply 126. Further, since the thickness of the dielectric body is freely adjustable, it is possible to control induction plasma, excited in the process room, over its distribution and density with high accuracy.

An exhaust pipe 136 communicating with exhausting means, such as vacuum pump 136a, is connected to the bottom of the process container 102. The inside atmosphere of the process room 102a can be set at an arbitrary pressure by exhausting the process room 102a by the exhausting means.

A gate valve 138 is arranged at one side of the process container 102. A new substrate L is loaded into the process room 102a from an adjacent load lock chamber (not shown) through the gate valve 138 by transfer means, such as a transfer arm (not shown), and a processed substrate L is unloaded from the process room 102a through the gate valve 138.

An explanation will be given in terms of an operation of the plasma etching apparatus shown in FIG. 1.

At first, an LCD substrate L is loaded into the process room 102a by the transfer arm (not shown) through the gate valve 138. At this time, the work table 106 is positioned at its lower position while the pusher pins (not shown) are at their upper positions. The transfer arm is retreated to the outside of the process container 102 through the gate valve 138 after handing the substrate L onto the pusher pins. Then, the pusher pins are moved down, so that the substrate L is mounted on the mount surface of the work table 106. Then, the work table 106 is moved up by the elevating mechanism to bring the periphery of the substrate L into contact with the bottom surface of the clamp frame 116, so that the substrate L is fixed on the work table 106.

The process room 102a is vacuum-exhausted by the vacuum pump 136a connected to the exhaust pipe 136. On the other hand, a predetermined process gas, such as $CF_4$ gas for etching $SiO_2$, or $BCl_3+Cl_2$ gas for etching Al, is fed into the process room 102a through the gas supply holes 128a of the process gas supply layer 118d. By doing this, the inside of the process room 102a is kept at a low pressure, such as about 30 mTorr.

An RF power of, for example, 13.56 MHz from the RF power supply 126 through the matching circuit 124 is applied to the RF antenna 120 embedded in the antenna embedding layer 118c of the antenna block 118. An electric field is formed in the process room 102a by means of induction caused by an inductance component of the RF antenna 120. Since the RF antenna 120 is embedded in the antenna embedding layer 118c of the antenna block 118, which is arranged in contact with the ceiling 102b of the process container 102, the thickness of a dielectric body on the side facing the target object can be less than that of a conventional apparatus. As a result, an electric field formed in the process room 102a can be stronger than that of the conventional apparatus, so that plasma having a higher density can be generated in the process room 102a.

The plasma thus excited in the process room 102a is moved toward the substrate L mounted on the work table 106 by a bias potential applied to the work table 106. The target surface of the substrate L is subjected to a predetermined etching process with the plasma. After the etching process is completed, the processed LCD substrate L is unloaded to the load lock chamber by the transfer arm through the gate valve 138, thereby finishing all the operation in order.

With a plasma processing apparatus according to the embodiment, which has been described with reference to FIGS. 1 to 4 exemplifying the etching apparatus, excellent advantages are obtained as follows:

Since a dielectric body, in which an RF antenna is embedded, is arranged in a process container to be in contact with the process container, the thickness of the dielectric body can be made thin, even if there is a large pressure difference between the atmosphere and the inside of a process room. As a result, an RF energy applied to the RF antenna is effectively used. Further, since the thickness of the dielectric body is freely adjustable, the distribution and density of an induction plasma excited in the process room can be controlled with high accuracy.

A process gas is uniformly supplied into the process room through a plurality of gas spouting holes formed in that surface of the dielectric body of the plasma processing apparatus which faces a target object. As a result, even where a wafer of a large diameter or an LCD substrate of a large surface area is to be processed, the process can be performed, with plasma having a uniform density, excited in the process room, so that the planar uniformity of the process is increased.

Since an antenna block of the plasma processing apparatus is formed of a plurality of stacked dielectric members, a structure, in which the RF antenna and a process gas supply passage are arranged, can be relatively easily manufactured. The antenna block formed of the multi-layer structure is strong, and its parts can be easily exchanged.

Figure 5:
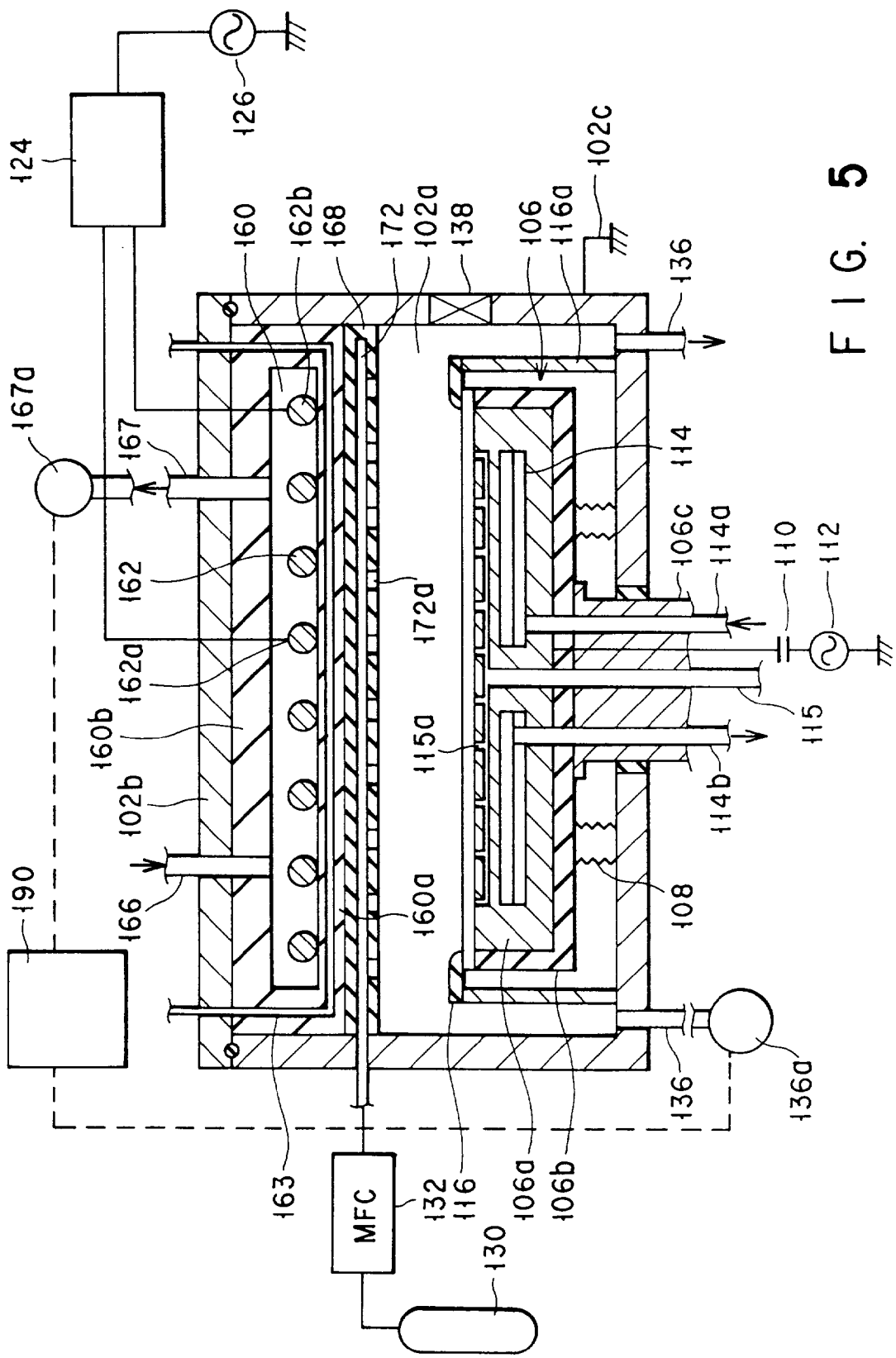
FIG. 5 is a cross-sectional view showing an etching apparatus of an LCD substrate, which is an application of a plasma processing apparatus according to another embodiment of the present invention.

FIG. 5 is a cross-sectional view showing an etching apparatus of an LCD substrate, which is an application of a plasma processing apparatus according to another embodiment of the present invention. In FIG. 5, the corresponding parts to those of the apparatus shown in FIG. 1 are provided with the same reference numbers, and their detailed explanation is given only when necessary.

Figure 6:
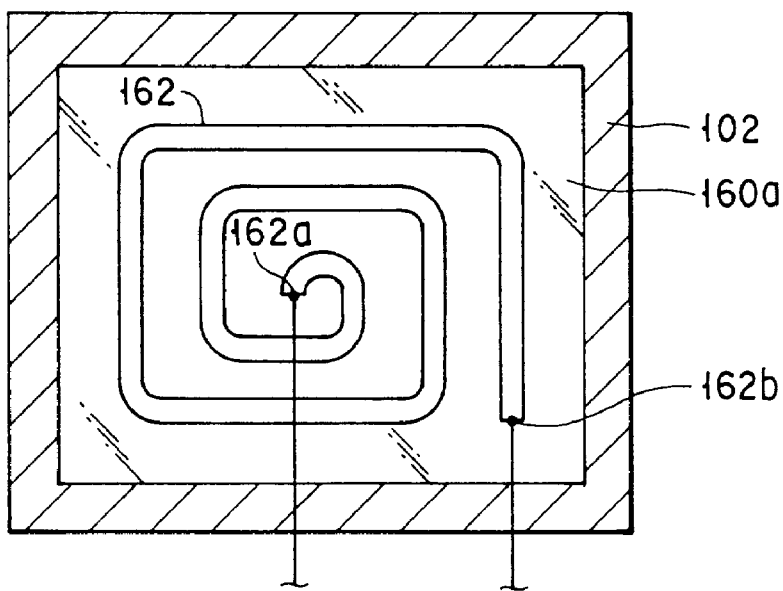
FIG. 6 is a plan view schematically showing an RF antenna of the etching apparatus shown in FIG. 5.

A hollow antenna block, i.e., an antenna room 160 is arranged to be in contact with that ceiling plate 102b of a process container 102, which substantially faces the mount surface of a work table 106 for an LCD substrate L. The antenna room 160 is defined by an airtight container made of a dielectric material, such as quartz glass or ceramics. As shown in FIG. 6, an RF antenna 162, which is made of a conductive material, such as copper, aluminum, or stainless steel, and has the shape of a spiral, coil, or loop, is arranged in the antenna room 160. Although the RF antenna 162 is formed of a spiral coil of two turns in FIG. 6, the RF antenna 162 can be modified as long as it has an antenna function for generating plasma, and may be formed of a one-turn coil when the frequency of an RF power is high. An RF power supply 126 for generating plasma is connected through an matching circuit 124 between the two terminals of the RF antenna 162, i.e., terminals 162a and 162b.

The antenna room 160 is constituted such that the thickness of a wall 160a facing the substrate L is smaller than that of a wall 160b which is in contact with the ceiling plate 102b of the process container 102. With this arrangement, an electric field, generated by an RF energy applied to the RF antenna 162 from the RF power supply 126, can be concentrated on the substrate L side. As a result, plasma having a density higher than that of a conventional apparatus can be generated in the process room 102a.

A gas supply pipe 166 is connected to the antenna room 160, so that an antenna room gas, such as an inactive gas, can be fed into the process room 160 for cooling and pressure-adjusting. An exhaust pipe 167 communicating with a vacuum pump 167a is also connected to the antenna room 160. Since the RF antenna 162, which is overheated due to application of an RF energy from the RF power supply 126, is cooled down by the antenna room gas, such as an inactive gas, it is possible to prolong the life of the RF antenna 162.

As shown in FIG. 5, a coolant passage 163 is formed in the wall of the antenna room 160, for allowing a coolant, such as cooling water, to flow. Since the antenna room 162 is prevented from being overheated, by cooling water flowing through the coolant passage 163, the life of the RF antenna 162 can be increased.

With the above described arrangement, the inside of the antenna room 160 can be set at a pressure lower than the atmospheric pressure, and preferably more than 100 Torr, by controlling the flow rate of a gas fed into the antenna room 160 from the gas supply pipe 166 L and/or the exhaust rate through the exhaust pipe 167. In contrast, according to a conventional apparatus, since an RF antenna is placed in the atmosphere, it is necessary for an dielectric body separating the atmosphere and a process room to be thick so as to withstand a pressure difference between the atmosphere and the inside pressure of the process room, such as several tens mTorr.

In other words, according to the apparatus shown in FIG. 5, since the inside of the antenna room 160 is set at a pressure lower than the atmospheric pressure, a pressure difference between the antenna room 160, in which the RF antenna 162 is arranged, and the process room 102a becomes small. As a result, the wall 160a arranged between the antenna room 160 and the process room 102a can be thin. It follows that, an electric field, generated by an RF energy applied to the RF antenna 162 from the RF power supply 126, can be concentrated in the process room 102a more than a conventional apparatus, so that plasma having a higher density can be generated.

A vacuum pump 136a connected to the bottom of the process room 102a and the vacuum pump 167a of the antenna room 160 may be connected to a pressure controller 190, if necessary, as shown in FIG. 5. With this arrangement, the exhaust rate of the vacuum pump 167a can be controlled by the controller 190 so as to allow the pressure difference between the process room 102a and the antenna room 160 to fall within a predetermined range.

A process gas supply member 168 is arranged on the bottom of the antenna room 160. The process gas supply member 168 is constituted such that a gas passage 172 is formed in a panel formed of a dielectric body, e.g., quartz. A number of holes 172a communicating with the gas passage 172 are formed in the surface of the process gas supply member 168 on the work table 106 side, in a manner the same as that of the holes 128a shown in FIG. 3, so that a shower head is constituted. A predetermined process gas, such as $CF_4$ gas for etching $SiO_2$, or $BCl_3+Cl_2$ gas for etching Al, is fed to the gas passage 172 from a process gas source 130 through a flow controller (MFC) 132, and then is spouted out from the holes 172a like a shower into the process room 102a. As a result, uniformity of a process gas density in the process room 102a is increased, so that plasma having a uniform density is excited in the process room 102a.

An explanation will be given in terms of an operation of the plasma etching apparatus shown in FIG. 5.

At first, an LCD substrate L is fixed to the work table 106, in a manner as described with reference to the apparatus shown in FIG. 1. Then, the process room 102a is vacuum-exhausted by the vacuum pump 136a connected to the exhaust pipe 136. On the other hand, a predetermined process gas, such as $CF_4$ gas for etching $SiO_2$, or $BCl_3+Cl_2$ gas for etching Al, is fed into the process room 102a through the gas supply holes 172a of the process gas supply member 168. By doing this, the inside of the process room 102a is kept at a low pressure, such as about 30 mTorr. At this time, an antenna room gas, such as an inactive gas, is fed into the antenna room 160 through the gas supply pipe 166, so that the inside of the antenna room 160 is kept at a pressure, such as 100 Torr, lower than the atmospheric pressure.

An RF power of, for example, 13.56 MHz from the RF power supply 126 through the matching circuit 124 is applied to the RF antenna 162 arranged in the antenna room 162. An electric field is formed in the process room 102a by means of induction caused by an inductance component of the RF antenna 162. The antenna room 162 is arranged in contact with the ceiling 102b of the process container 102, and the dielectric wall 160a facing the target object can be thinner than that of a conventional apparatus. As a result, an electric field formed in the process room 102a can be stronger than that of the conventional apparatus, so that plasma having a higher density can be generated in the process room 102a.

The target surface of the substrate L is subjected to a predetermined etching process with the plasma thus excited in the process room 102a. After the etching process is completed, the processed LCD substrate L is unloaded to the load lock chamber, in a manner as described with reference to the apparatus shown in FIG. 1, thereby finishing all the operation in order.

With a plasma processing apparatus according to the embodiment, which has been described with reference to FIGS. 5 and 6 exemplifying the etching apparatus, excellent advantages are obtained as follows:

Since a hollow antenna block, i.e., an antenna room is arranged in a process room and can be kept at a pressure lower than the atmospheric pressure, side walls of the antenna room can be thinner than a dielectric body used in a conventional apparatus for separating the atmosphere and a low pressure inside of a process room. As a result, an RF energy applied from an RF power supply is effectively transmitted to the inside of the process room. Further, since a side wall of the antenna room is in contact with a side wall of the process room, which is grounded, an electric field generated by an RF power can be concentrated on an opposite surface, i.e., a surface facing a target object, so that plasma having a high density is generated.

An RF antenna heated by application of an RF energy from the RF power supply can be cooled by an antenna room gas. The inside of the antenna room can be set at a predetermined pressure lower than the atmospheric pressure by adjusting the supply rate and exhaust rate of the antenna room gas.

Since a wall of the antenna room facing the target object is thinner than walls of the antenna room facing walls of the process room, an electric field having a high density is formed toward the target object by an RF power. As a result, an applied RF energy is effectively used and plasma having a high density is generated.

Process gas supply means may be arranged in the wall of the antenna room facing the target object, so that a process gas is fed into the process room through, for example, gas supply holes arranged on the surface facing the target object. With this arrangement, the process gas has a uniform distribution density, and plasma generated in the process room has a uniform density.

A coolant passage may be formed in the wall of the antenna room facing the target object for allowing a coolant to flow. With this arrangement, the antenna room, which may be overheated, is cooled down by, for example, cooling water flowing in the coolant passage.

Figure 7:
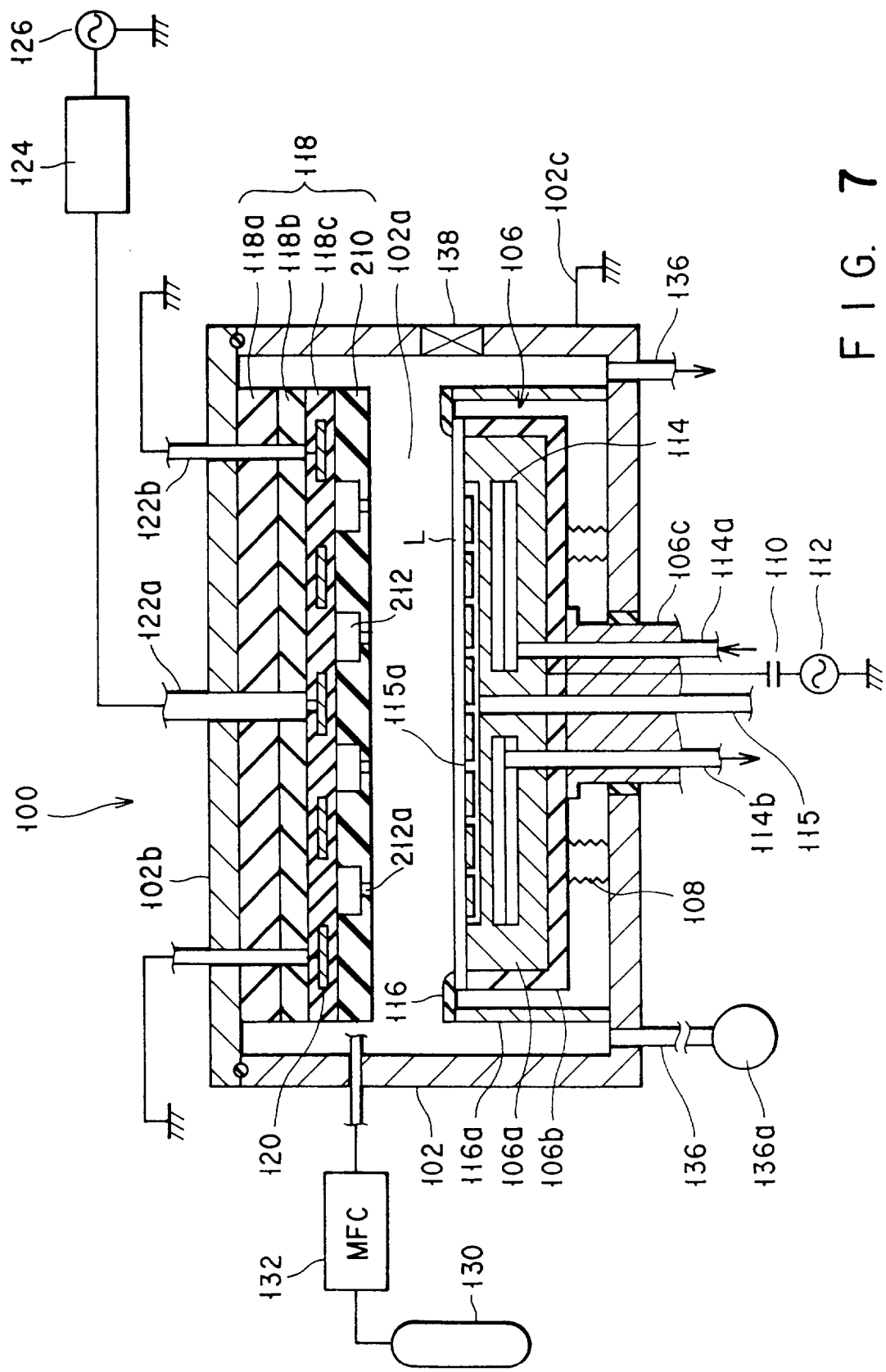
FIG. 7 is a cross-sectional view showing an etching apparatus of an LCD substrate, which is an application of a plasma processing apparatus according to still another embodiment of the present invention.

FIG. 7 is a cross-sectional view showing an etching apparatus of an LCD substrate, which is an application of a plasma processing apparatus according to still another embodiment of the present invention. This embodiment is essentially the same as the embodiment shown in FIG. 1, except that a process gas supply layer 210, which is the lowermost layer of a antenna block 118 for defining a shower head, differs from the process gas supply layer 118d shown in FIG. 1 as follows. In FIG. 7, therefore, the corresponding parts to those of the apparatus shown in FIG. 1 are provided with the same reference numbers, and their detailed explanation is given, when necessary.

The process gas supply layer 210 is formed of a panel of a dielectric body, e.g., quartz, as the process gas supply layer 118d is. That surface of the process gas supply layer 210 which faces an antenna embedding 118c is provided with grooves for constituting a gas passage 212. The gas passage 212 extending in parallel to a mount surface of a work table 106 is formed from the grooves of the process gas supply layer 210 by bonding the layers 118c and 210 to each other. A number of holes 212a are formed in the process gas supply layer 210 to be opened from the gas passage 212 toward the mount surface of the work table 106. A predetermined process gas, such as $CF_4$ gas for etching $SiO_2$, or $BCl_3+Cl_2$ gas for etching Al, fed into the gas passage 212 is spouted out from the holes 212a like a shower into the process room 102a. As a result, uniformity of a process gas density in the process room an 102a is increased, so that plasma having a uniform density is excited in the process room 102a.

More specifically, as shown in FIG. 8, the gas passage 212 has a symmetric shape, up and down, and right and left in FIG. 8. The gas passage 212 consists of a pair of inlets 214 connected to a process gas source 130 through a mass flow controller (MFC) 132, a pair of manifolds 216 respectively connected to the inlets 214 at right angles, and a plurality of, for example, six, branches 218 extending across the process gas supply layer 210 to connect the manifolds 216. For example, the branches 218 have rectangular cross sections of the same cross-sectional area, and are provided with the gas spouting holes 212a uniformly distributed therein.

Since the shower head is defined by the process gas supply layer 210 formed of a dielectric panel, the shower head, in other words, is constituted by a combination of a dielectric solid part and a hollow including the gas passage 212. Where the solid part and the hollow have projected areas A1 and A2, respectively, on the planar outer-contour of the mount surface of the work table 106, A2/(A1+A2) is set to be less than 0.4, and is preferably set to fall in a range of form 0.15 to 0.25. These conditions of the projected areas has been determined on the basis of interaction between the gas passage 212 and an RF induction electric field generated by the RF antenna 120.

In the gas passage 212 interposed between the RF antenna 120 and the process room 102a, the process gas is apt to cause electric discharge and to be turned into plasma due to an effect of the electric field. The electric field energy to be supplied from the RF antenna 120 to the process room 102a is decreased by this plasma generation, thereby causing a loss in the electric field due to the presence of the gas passage 212.

Figure 9:
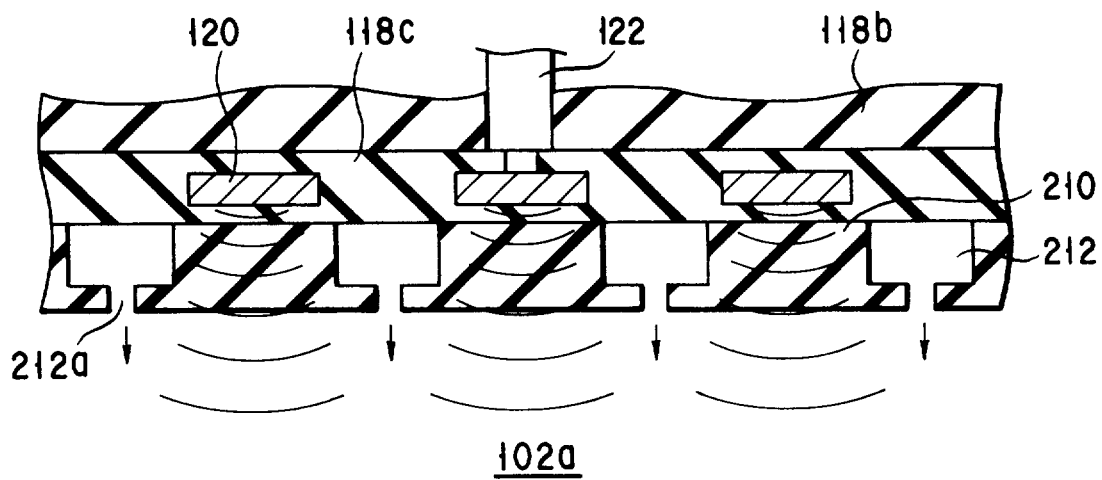
FIG. 9 is a cross-sectional view showing a positional relation between an RF antenna and a process gas passage in the etching apparatus shown in FIG. 7.

In the present invention, however, the hollow of the process gas supply layer 210 has such a projected area ratio, on a planar outer-contour of the mount surface of the work table 106, that is less 40% and preferably from 15% to 25%. As a result, as shown in FIG. 9, the portions between the RF antenna 120 and the process room 102a are occupied mainly by the solid dielectric body of the process gas supply layer 210. It is therefore possible to increase the coefficient of use of an applied energy from the RF power supply through the RF antenna 120. Although the electric field energy loss due to the presence of the gas passage 212 cannot be perfectly eliminated, the process room 102a is supplied with a sufficient electric field energy through those portions of the process gas supply layer 210 at which there is no gas passage 212.

Further, in a planar layout relative to the mount surface of the work table 106, both of the gas passage 212 and the RF antenna 120 are arranged substantially line-symmetric or point-symmetric relative to the center of the mount surface of the work table 206, for the following reasons. Namely, the electric field energy to be supplied to the process room 102a form the RF antenna 120 differs among portions, depending on whether the gas passage 212 exists or not, because of the energy loss caused by turning the process gas into plasma in the gas passage 212. This can be one of the causes of low uniformity in an RF induction electric field generated in the process room 102a by the RF antenna 120. Accordingly, as in this embodiment, not only by decreasing the projected area of the gas passage 212, but also by designing the shapes of the gas passage 212 and the RF antenna 120 to be substantially line-symmetric or point-symmetric relative to the center of the target substrate L on the work table 206, i.e., the center of the mount surface, it is possible to further facilitate an increase in uniformity of a plasma process.

Figure 11:
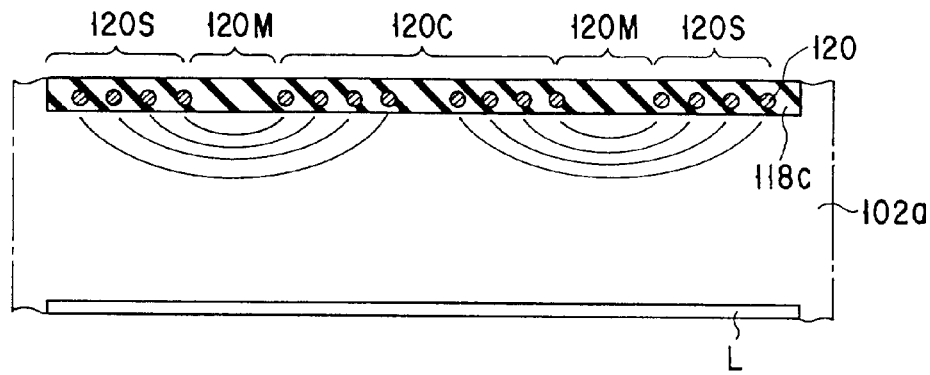
FIG. 11 is a view schematically showing the intensity distribution of electric field energy supplied by the RF antenna in the etching apparatus shown in FIG. 7.
Figure 12:
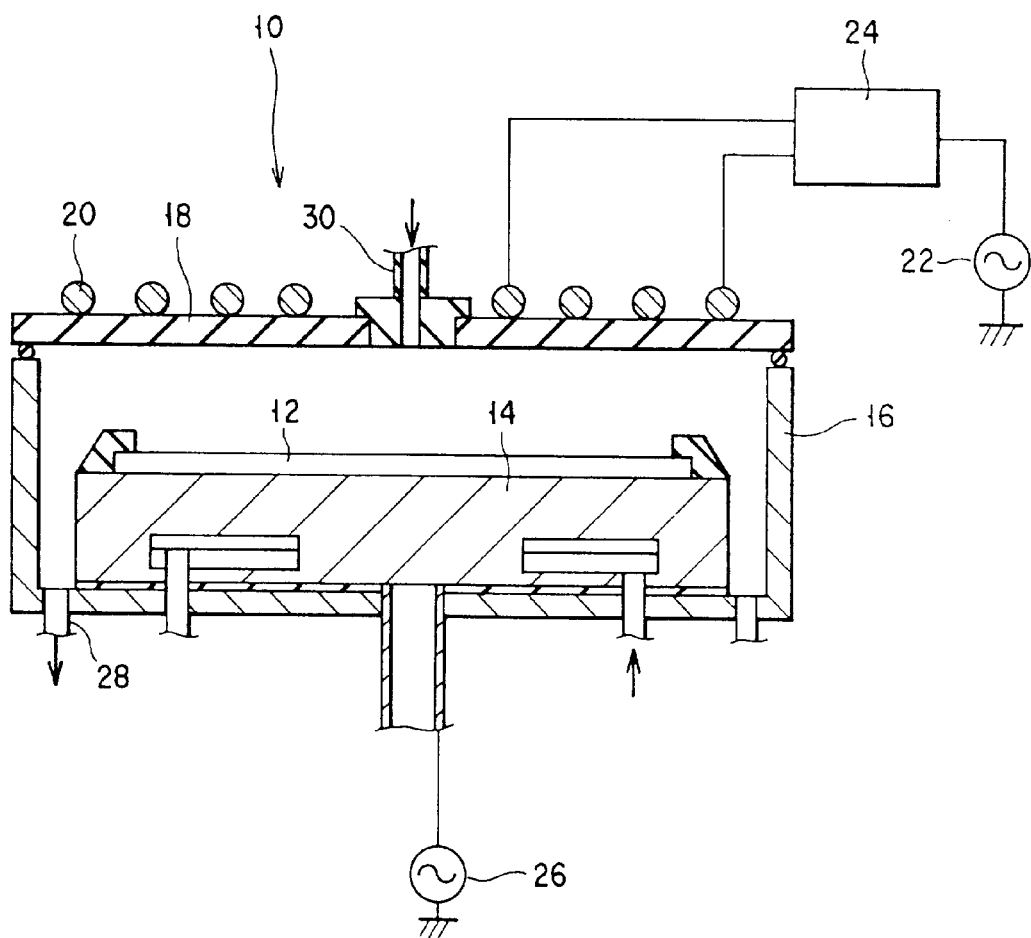
FIG. 12 is a cross-sectional view schematically showing a conventional plasma processing apparatus of the RF induction coupling type.

The electric field energy supplied by the antenna 120 generates an intensity distribution which is schematically shown in FIG. 11. The antenna 120 has an inner portion 120C and an outer portion 120S separated from each other, and an intermediate portion 120M formed therebetween, in which little part of the antenna exists, as shown in FIGS. 8 and 11. However, the electric field generated by the combination of the inner and outer portions 120C and 120S becomes most intensified at the intermediate portion 120M. Accordingly, where the gas passage 212 is arranged directly under the intermediate portion 120M, that part of the electric field energy which passes through a portion corresponding to the intermediate portion 120M can be lowered. With this arrangement, it is possible to increase the uniformity of field intensity in the process room 102a, thereby uniformly turning the process gas into plasma.

Figure 10:
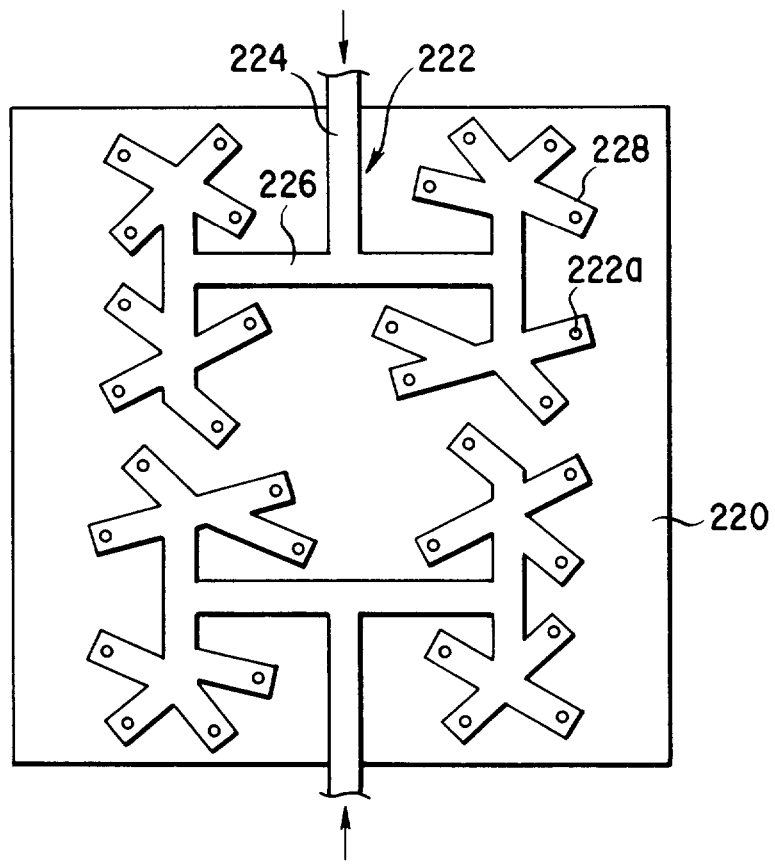
FIG. 10 is a plan view showing a modification of the process gas supply layer of the etching apparatus shown in FIG. 7.

FIG. 10 is a plan view showing a modification of the process gas supply layer of the etching apparatus shown in FIG. 7.

In this modification, the process gas supply layer 220 is formed of a panel of a dielectric body, e.g., quartz, as the process gas supply layer 118d is. A gas passage 222 extending in parallel to a mount surface of a work table 106 is formed in the process gas supply layer 220. A number of holes 222a are formed in the process gas supply layer 220 to be opened from the gas passage 222 toward the mount surface of the work table 106.

More specifically, the gas passage 222 has a point-symmetric shape relative to the center of the mount surface of the work table 106. The gas passage 222 consists of a pair of inlets 224 connected to a process gas source 130 through a mass flow controller (MFC) 132, a pair of manifolds 226 respectively connected to the inlets 224 at right angles, and a number of branches 228 branching from the ends of the manifolds 226. The inlets 224, the manifolds 226, and the blanches 228 have, for example, rectangular cross sections of the same cross-sectional area. The gas spouting holes 222a are respectively arranged only at the ends of the branches 228 one by one. The gas passage 222 is the same length from the inlets 224 to the gas spouting holes 222a, so that the conductance from the inlets 224 to the gas spouting holes 222a is constant or equal. With this arrangement, the process gas can be uniformly distributed into a process room 102a.

The above described characteristics, concerning the projected area and arrangement of the gas passage 212, and conductance of the gas passage 212, can be applied to the apparatus shown in FIG. 5 in which the RF antenna 120 is arranged in the hollow antenna block, i.e., antenna room 160, and also to an apparatus in which an RF antenna is arranged outside a process room.

With a plasma processing apparatus according to the embodiment, which has been described with reference to FIGS. 7 to 10 exemplifying the etching apparatus, excellent advantages are obtained as follows:

Since an area ratio and positions are specified for those portions of a shower head gas passage which overlap with an RF antenna in a planar layout relative to the mount surface of a work table, the gas passage and an RF induction electric field generated by the RF antenna can be prevented from being affected by the interaction therebetween. As a result, a process gas can be uniformly turned into plasma, while the progress of dissociation of the process gas can be accurately controlled.

Further, where the gas passage is designed to have equal conductance from inlets to gas spouting holes, the process gas can be uniformly distributed into a process room.

Although an LCD substrate is processed as a target object in the above described embodiments, the present invention can be applied to a processing apparatus in which a semiconductor wafer is processed as a target object. Further, although the present invention is applied to an etching apparatus in the above described embodiments, the present invention can be applied to other apparatuses using plasma, such as an ashing apparatus, a plasma CVD apparatus, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus for processing a target substrate, using a plasma comprising:
   a process container forming an airtight process room;
   a work table arranged in said process room and having a mount surface for supporting said target substrate;
   a main exhaust for exhausting and setting said process room into a vacuum state;
   an RF antenna for generating an electric field above said mount surface in said process room;
   a power supply section for applying an RF power to said RF antenna; and
   a main supply for supplying a process gas into said process room, at least part of said process gas being turned into said plasma by said electric field, wherein said main supply comprises a shower head arranged between said mount surface and said RF antenna to face said mount surface, and said shower head comprises a gas passage extending substantially parallel to said mount surface and a plurality of gas spouting holes opened toward said mount surface;
   wherein said shower head is defined by a dielectric panel consisting essentially of a dielectric solid part and a hollow including said gas passage, and $A2/(A1+A2)$ is set to be less than 0.4 where said solid part and said hollow have projected areas $A1$ and $A2$, respectively, on a planar outer-contour of said mount surface;
   wherein said RF antenna comprises a loop portion surrounding a central position, which corresponds to a center of said work table, and a radial portion extending radially from said center position; and
   wherein said gas passage comprises a pair of manifolds interposing said central position, and branches extending to connect said manifolds to each other and provided with said gas spouting holes, said manifolds being arranged substantially not to overlap said loop portion.

2. The apparatus according to claim 1, wherein said $A2/(A1+A2)$ is set to fall in a range of from 0.15 to 0.25.

3. The apparatus according to claim 1, wherein, in a planar layout relative to said mount surface of said work table, said gas passage and said RF antenna are arranged to be substantially line-symmetric or point-symmetric relative to said central portion.

4. The apparatus according to claim 1, wherein said gas passage comprises a plurality of branches, only at ends of which said gas spouting holes are arranged, and said gas passage has a substantially equal conductance from an inlet to said gas spouting holes.

5. The apparatus according to claim 4, wherein said branches have substantially equal cross-sectional areas, and said gas passage is substantially equal in length from said inlet to said gas spouting holes.

6. The apparatus according to claim 1, comprising an antenna block arranged in contact with an inner surface of said process room and facing said mount surface, said RF antenna being arranged in said antenna block.

7. The apparatus according to claim 6, wherein said dielectric panel defining said shower head constitutes an opposite wall of dielectric of said antenna block, which is present between said mount surface and said RF antenna to face said mount surface.

8. The apparatus according to claim 7, wherein said antenna block comprises an embedding layer of dielectric other than said opposite wall, said RF antenna being embedded in said embedding layer.

9. The apparatus according to claim 8, wherein said antenna block comprises a substantially solid body between said inner surface of said process room in contact with said antenna block and said embedding layer.

10. The apparatus according to claim 7, wherein said antenna block forms a hollow and airtight antenna room, and said apparatus comprises an auxiliary exhaust for exhausting and setting said antenna room into a vacuum state.

11. The apparatus according to claim 10, comprising a pressure controller connected to said auxiliary exhaust for maintaining a difference in pressures between said process and antenna rooms smaller than a certain value.

12. The apparatus according to claim 1, wherein said process container consists essentially of a conductive material.

13. The apparatus according to claim 12, further comprising grounding means for grounding said container.

14. The apparatus according to claim 1, wherein said loop portion of said RF antenna comprises an outer loop arranged around said radial portion, and said manifolds and said branches of said gas passage are arranged inside said outer loop so as not to overlap said outer loop.

15. The apparatus according to claim 14, wherein said RF antenna comprises an inner loop surrounding said central position and connected to said outer loop through said radial portion, and said manifolds of said gas passage are arranged outside said inner loop so as not to overlap said inner loop.

16. The apparatus according to claim 14, wherein said gas passage comprises a pair of inlets respectively connecting said manifolds to a source of said process gas, and said gas passage overlaps said outer loop only at said inlets.

17. The apparatus according to claim 1, wherein said inlets extend substantially perpendicularly across said outer loop.

* * * * *